(12) United States Patent
Miller

(10) Patent No.: US 7,019,546 B1
(45) Date of Patent: Mar. 28, 2006

(54) TEST HEAD FOR INTEGRATED CIRCUIT TESTER

(75) Inventor: Wayne H. Miller, Los Altos, CA (US)

(73) Assignee: Credence Systems Corporation, Milpitas, CA (US)

( * ) Notice: Subject to any disclaimer, the term of this patent is extended or adjusted under 35 U.S.C. 154(b) by 15 days.

(21) Appl. No.: 10/877,480

(22) Filed: Jun. 25, 2004

(51) Int. Cl.
*G01R 31/26* (2006.01)

(52) U.S. Cl. ............... 324/765; 324/754; 324/158.1

(58) Field of Classification Search ............. None
See application file for complete search history.

(56) References Cited

U.S. PATENT DOCUMENTS 5,952,842 A * 9/1999 Fujimoto ............... 324/760
6,462,532 B1 * 10/2002 Smith ................... 324/158.1

* cited by examiner

*Primary Examiner*—Vinh Nguyen
*Assistant Examiner*—Jimmy Nguyen
(74) *Attorney, Agent, or Firm*—John Smith-Hill; Smith-Hill and Bedell

(57) ABSTRACT

A test head for a semiconductor integrated circuit tester includes first and second card cages and first and second groups of interface connectors for engagement by DUT edges of pin electronics cards installed in the first and second card cages respectively. The interface connectors of the first group are inclined at an angle less than 180° to the interface connectors of the second group.

16 Claims, 2 Drawing Sheets

TEST HEAD FOR INTEGRATED CIRCUIT TESTER

CROSS-REFERENCE TO RELATED APPLICATION

Subject matter disclosed in this application may be considered to be related to subject matter disclosed in copending patent application Ser. No. 10/877,478 filed Jun. 25, 2004, the entire disclosure of which is hereby incorporated by reference herein for all purposes.

BACKGROUND OF THE INVENTION

This invention relates to a test head for an integrated circuit tester.

The test head of a conventional semiconductor integrated circuit tester may be used in conjunction with a wafer prober. The test head is typically placed directly above the wafer prober for sequentially testing wafers that are delivered to the test head from below. The test head houses pin electronics on rectangular pin electronics cards, and the pin electronics cards are disposed in the test head so that each card lies in a vertical plane with vertical and horizontal edges. Each card has pin electronics terminals distributed along its lower horizontal edge and these terminals are connected to the device under test (DUT) through a so-called pogo tower, a DUT board (or device interface board) and a probe card.

In operation of the test head, a large amount of heat is dissipated from the pin electronics. Heat is removed from the test head by inducing a flow of air over the surfaces of the pin electronics cards. The pin electronics cards may be arranged so that they radiate from a vertical axis, but heat removal is more efficient if the cards are disposed parallel to each other. For compactness, the cards may be arranged in two parallel rows.

It is desirable that the signal path length between a pin electronics terminal of a pin electronics card and the corresponding terminal of the probe card should be short and should be uniform over all the pin electronics terminals.

The distance between a pin electronics terminal of a pin electronics card and the corresponding terminal of the probe card depends on the position of the pin electronics terminal along the lower edge of the pin electronics card. In order to achieve the desired uniform signal path length, it is necessary to compensate for the variation in distance between the pin electronics terminals of the pin electronics cards and the corresponding terminals of the probe card. This can be accomplished by appropriately designing the pattern of conductive traces of the DUT board, but the DUT board is then more expensive than would otherwise be the case.

To increase heat removal efficiency, it would be desirable to provide an air collection plenum between the two rows of pin electronics cards, but this would increase the distance between the pin electronics terminals and the corresponding terminals of the probe card, exacerbating the problem of non-uniformity of signal path length.

SUMMARY OF THE INVENTION

In accordance with a first aspect of the invention there is provided a test head for a semiconductor integrated circuit tester, the test head comprising first and second card cages, and first and second groups of interface connectors for engagement by DUT edges of pin electronics cards installed in the first and second card cages respectively, and wherein the interface connectors of the first group are inclined at an angle less than 180° to the interface connectors of the second group.

In accordance with a second aspect of the invention there is provided a test head for an integrated circuit tester, the test head comprising first and second card cages, and first and second groups of pin electronics cards located in the first and second card cages respectively, each pin electronics card having a DUT edge and an opposite tester edge, and wherein the DUT edges of the first group of pin electronics cards are inclined at an angle less than 180° to the DUT edges of the second group of pin electronics cards.

In accordance with a third aspect of the invention there is provided a test head for an integrated circuit tester, the test head comprising first and second card cages, each card cage having first and second opposite walls, wherein the first and second walls of the first cage are parallel to each other, the first and second walls of the second cage are parallel to each other, the first and second walls of each card cage are formed with guides for receiving pin electronics cards, the first wall of the first card cage is nearer than the second wall of the first card cage to the second card cage, the first wall of the second card cage is nearer than the second wall of the second card cage to the first card cage, and the first wall of the first card cage and the first wall of the second card cage are mutually inclined at an acute angle.

BRIEF DESCRIPTION OF THE DRAWINGS

For a better understanding of the invention, and to show how the same may be carried into effect, reference will now be made, by way of example, to the accompanying drawings, in which.

DETAILED DESCRIPTION

Figure 1:
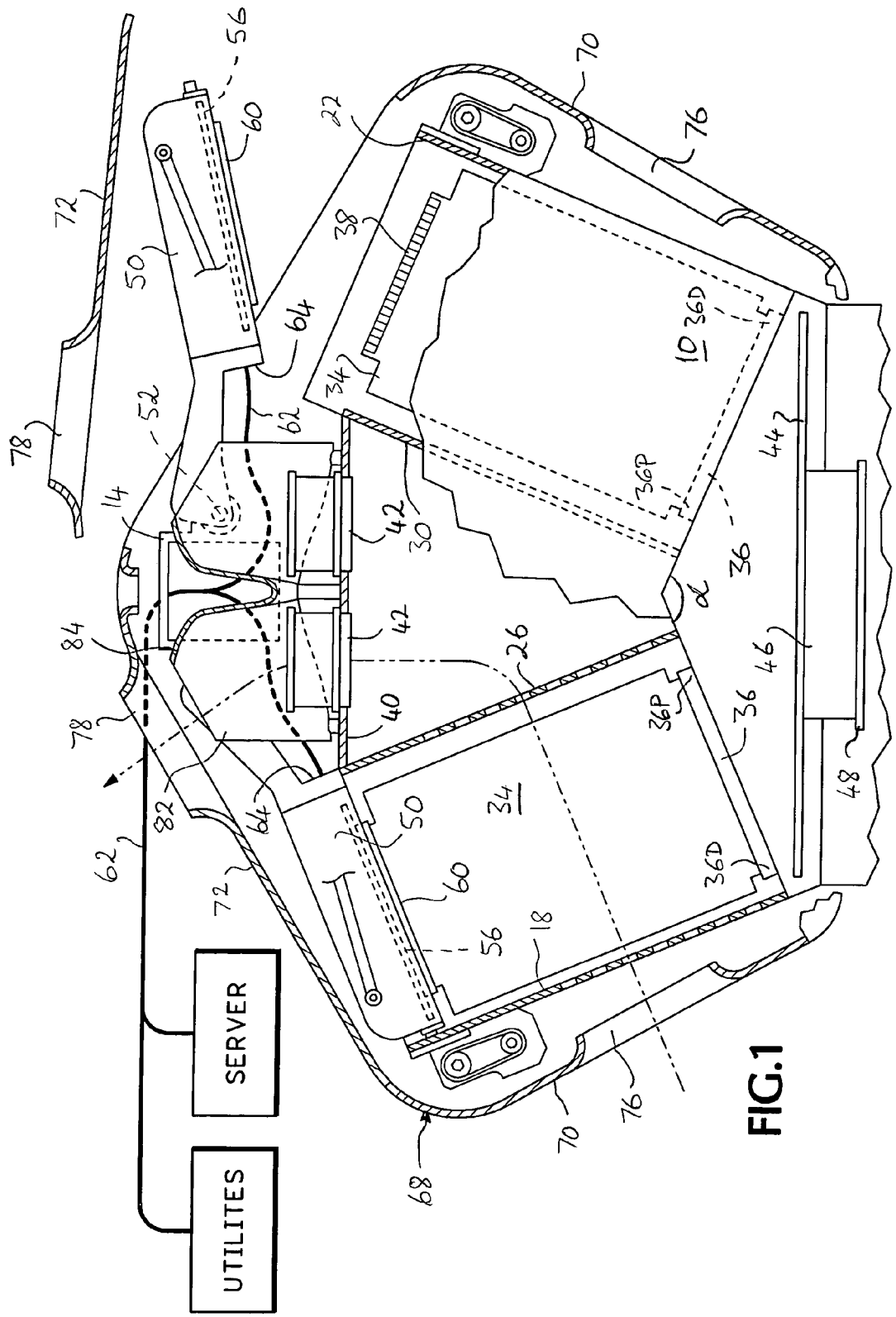
FIG. 1 is an end view of a test head of a semiconductor integrated circuit tester.

The test head illustrated in the drawings comprises an inner main housing having two vertical end walls 10, 14 and two outer side walls 18, 22 that are perpendicular to the end walls. The main housing has two interior walls 26, 30 that are in spaced, parallel relationship with the side walls 18, 22 respectively. The two pairs of walls 18, 26 and 22, 30 define respective compartments. Each of the walls 18, 22, 26, 30 is provided with guides (not shown) that define slots for receiving up to eighteen rectangular pin electronics cards 34. Thus, each pair of walls provides a card cage for up to eighteen cards. The slots are arranged so that each pin electronics card is disposed in a vertical plane and the cards are parallel to each other. At the base of each slot is an interface connector 36 that is engaged by the pin electronics card when it is installed in the slot. Each card has a releasable retention latch (not shown) for holding the card in position when it has been installed. Each card is provided at its upper edge with a receptacle 38 of a multi-pin connector. The test head is used in conjunction with a server for supplying test instructions to, and receiving test data from, the pin electronics cards.

It will be seen from FIG. 1 that the side walls 18, 22 and interior walls 26, 30 of the compartments are not vertical but, on the contrary, are inclined to the vertical such that the interior walls 26, 30 converge downwardly and define a V-shaped chamber therebetween. The chamber is closed at the top by a fan support plate 40, and two rows of three fans 42 are mounted in the fan support plate.

In normal operation, the chamber is at the suction side of the fans and the fans induce a flow of cooling air through the perforated side walls 18, 22 and interior walls 26, 30, as shown by the dashed lines and arrows, into the V-shaped chamber which therefore serves as an air collection plenum between the two interior walls 26, 30. The cooling air flows between the pin electronics cards, removing heat from the pin electronics. The fans discharge air upwardly from the chamber. Because the interior walls 26, 30 diverge upwardly, an adequate plenum is provided even though the minimum distance between the interior walls 26, 30 is quite small.

The bottom walls of the two compartments converge upwardly at an angle α of about 135° and the interface connectors 36 are accordingly inclined to the horizontal at an angle of about 22.5°. For a given volume of the plenum, the lower edges of the interior walls 26 and 30 are closer together than if the walls 26 and 30 were parallel. Further, because the bottom walls of the compartments converge upwards, the proximal ends 36P of the interface connectors are closer together than if the bottom walls were horizontal, for a given volume of the plenum.

As shown in FIG. 1, the test head is positioned above a wafer prober (shown partially and only schematically) that is used to deliver wafers to the test head from below. The pin electronics cards are electrically connected to the device under test through the interface connectors 36, a pogo tower, a DUT board 44, a pogo tower 46, and a probe card 48. The pattern of conductive traces on the DUT board is designed so that variations in signal path length between the pin electronics terminals and the corresponding terminals of the probe card are within an acceptable limit. Because the proximal ends 36P of the interface connectors on the two sides of the test head are relatively close together, and the distal ends 36D are relatively close together and are closer than the proximal ends 36P to the DUT board, less space is required on the DUT board for conductor traces that would otherwise be needed to compensate for variation in signal path length.

The housing includes two covers 56 that pivot relative to the housing walls for engaging and disengaging the connectors 38 at the upper edges of the pin electronics cards 34. The pivot axes of the two covers (only one of the pivot axes, designated 52, is shown in FIG. 1) are perpendicular to the planes of the pin electronics cards and are disposed over the air collection plenum. Each cover incorporates a backplane 56 that includes connectors 60 for supplying power and signals to the pin electronics cards, and for receiving signals from the pin electronics cards. The connectors 60 are in turn connected to cables 62 that enter the cover at the hinge edge 64 of the cover.

Figure 2:
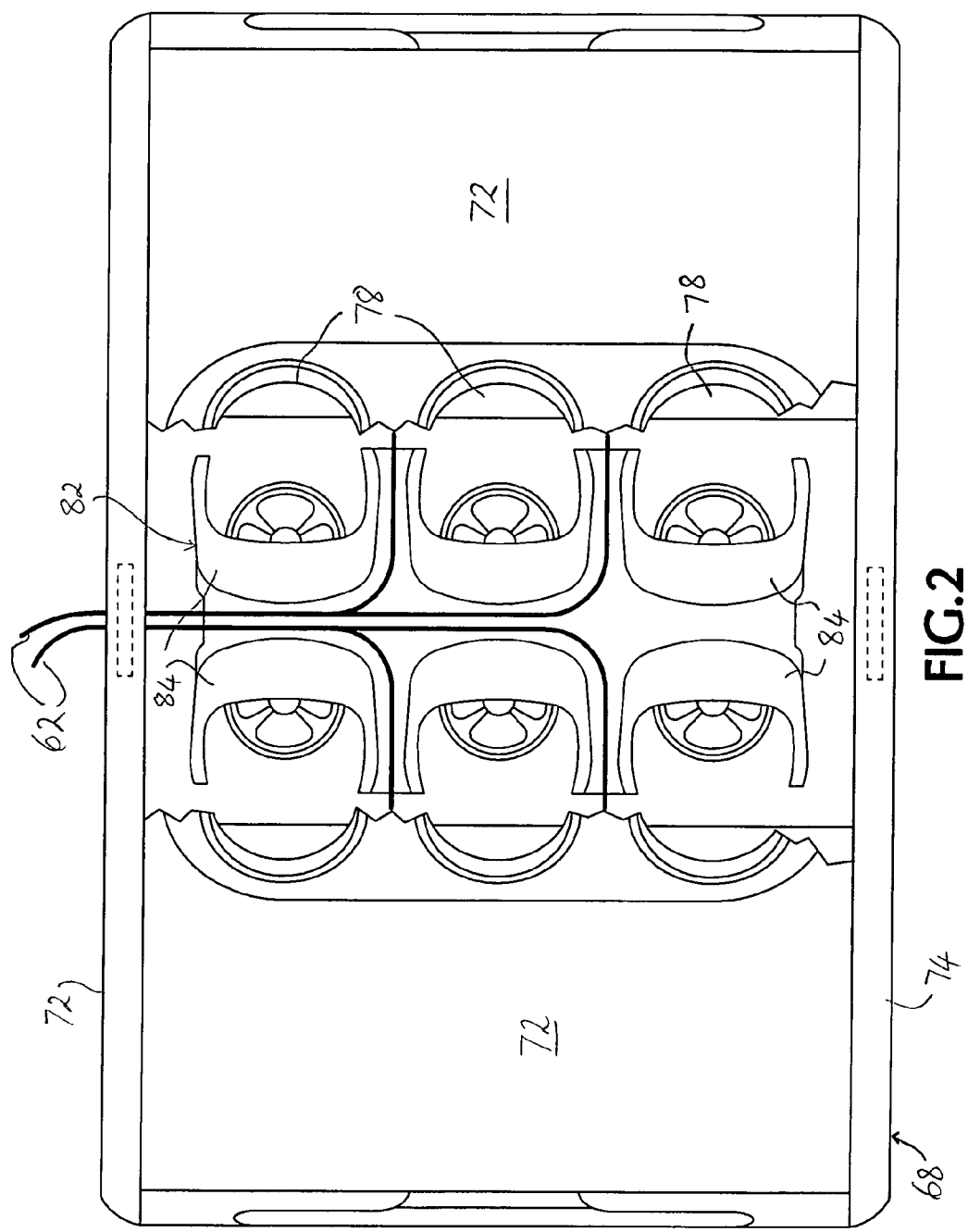
FIG. 2 is a partially broken away top plan view of the test head shown in FIG. 1.

When the test head is in use, it is located in an outer casing 68 that conforms generally in configuration to the exterior configuration of the main housing and has two downwardly converging side walls 70 and two upwardly converging top walls 72 (one of which is shown separately from the rest of the casing) that meet above the plenum. The casing also has two opposite end walls 74 (FIG. 2) and at least one of the end walls is formed with an opening for permitting entry of cables and hoses. The casing has two air inlet ports 76 in the side walls and two rows of three air outlet ports 78 in the top walls respectively.

A fan duct 82 is positioned above the plenum. The fan duct is a thermoformed structure that is located between the test head housing and the outer casing 68 and provides two rows of air ducts 84 that extend from the pressure side of the fans to the air outlet ports 78 of the outer casing.

Cables and hoses are threaded between the two rows of ducts and are branched off to each side, between the ducts in each row, for connection to the backplanes 56.

Because the cables and hoses enter the cover at the hinge edge and the cover moves pivotally for engaging and disengaging the pin electronics cards, potential damage to the cables and holes during engaging and disengaging movement of the cover is avoided without it being necessary to provide substantial slack in the cables.

It will be appreciated that the invention is not restricted to the particular embodiment that has been described, and that variations may be made therein without departing from the scope of the invention as defined in the appended claims and equivalents thereof. For example, the invention is not restricted to the bottom walls of the two compartments converging at an angle of about 135°. It is desirable that the bottom walls converge at an angle in the range from 60° to 175°, and it is preferred that the angle be at least 120°. Unless the context indicates otherwise, a reference in a claim to the number of instances of an element, be it a reference to one instance or more than one instance, requires at least the stated number of instances of the element but is not intended to exclude from the scope of the claim a structure or method having more instances of that element than stated.

The invention claimed is:

1. A test head for a semiconductor integrated circuit tester, the test head comprising:
   first and second card cages, and
   first and second groups of interface connectors for engagement by DUT edges of pin electronics cards installed in the first and second card cages respectively,
   and wherein the interface connectors of the first group are inclined at an angle less than 180° to the interface connectors of the second group.

2. A test head according to claim 1, wherein each interface connector has a tester side for engaging a pin electronics card and a DUT side opposite the tester side, and the test head further comprises a device interface board having tester side terminals that are connected to the terminals of the pin electronics cards and also having device side terminals for connection to a device under test.

3. A test head according to claim 1, wherein the interface connectors of the first group are inclined at an obtuse angle to the interface connectors of the second group.

4. A test head according to claim 3, wherein the interface connectors of the first group are inclined at an angle in the range from 120° to 175° to the interface connectors of the second group.

5. A test head according to claim 1, wherein the interface connectors of the first group are inclined at an angle in the range from 60° to 175° to the interface connectors of the second group.

6. A test head according to claim 1, wherein the first and second card cages have first and second bottom walls respectively, the first and second bottom walls are inclined to each other at said angle less than 180°, and the interface connectors of the first and second groups are mounted in the first and second bottom walls respectively.

7. A test head for an integrated circuit tester, the test head comprising:
   first and second card cages, and
   first and second groups of pin electronics cards located in the first and second card cages respectively, each pin electronics card having a DUT edge and an opposite tester edge, and wherein the DUT edges of the first group of pin electronics cards are inclined at an angle less than 180° to the DUT edges of the second group of pin electronics cards.

8. A test head according to claim 7, wherein each pin electronics cards is provided at its DUT edge with terminals for connection to a device under test and the test head further comprises a device interface board having tester side terminals that are connected to the terminals of the pin electronics cards and also having device side terminals for connection to a device under test.

9. A test head according to claim 7, wherein the first and second card cages have first and second bottom walls respectively, the first and second bottom walls are inclined to each other at said angle less than 180°, the test head further comprises first and second groups of interface connectors for engagement by DUT edges of pin electronics cards installed in the first and second card cages respectively, and the interface connectors of the first and second groups are mounted in the first and second bottom walls respectively.

10. A test head for an integrated circuit tester, the test head comprising:
   first and second card cages, each card cage having first and second opposite walls, wherein the first and second walls of the first cage are parallel to each other, the first and second walls of the second cage are parallel to each other, the first and second walls of each card cage are formed with guides for receiving pin electronics cards, the first wall of the first card cage is nearer than the second wall of the first card cage to the second card cage, the first wall of the second card cage is nearer than the second wall of the second card cage to the first card cage, and the first wall of the first card cage and the first wall of the second card cage are mutually inclined at an acute angle.

11. A test head according to claim 10, wherein the first and second card cages each have an opening for insertion of pin electronics cards into the card cage in a direction along an insertion axis, the test head further comprises first and second groups of interface connectors for engagement by DUT edges of pin electronics cards installed in the first and second card cages respectively, and the first wall of the first card cage and the first wall of the second card cage converge towards a device location.

12. A test head according to claim 10, comprising first and second groups of pin electronics cards located in the first and second card cages respectfully, each pin electronics card having a DUT edge and an opposite tester edge in engagement with first and second groups of interface connectors respectively, and a DUT board having tester side terminals that are connected to the terminals of the interface connectors and also having device side terminals for connection to a device under test, wherein the DUT board is substantially perpendicular to a plane that bisects the angle between the first wall of the first card cage and the first wall of the second card cage.

13. A test head according to claim 10, wherein the first wall of each card cage is perforated, the first wall of the first card cage and the first wall of the second card cage define an air collection plenum therebetween and the test head further comprises a baffle wall joining the first wall of the first card cage and the first wall of the second card cage and at least one fan mounted in the baffle wall for inducing a flow of air into the air collection plenum by way of the first wall of the first card cage and the first wall of the second card cage.

14. A test head according to claim 13, comprising first and second rows of fans mounted in the baffle wall, wherein the first and second card cages are mounted in a casing, and the test head further comprises a duct structure between the baffle wall and the casing for directing air flow from the fans to respective ports in the casing.

15. A test head according to claim 14, wherein the first card cage has a cover that is pivotally mounted relative to the walls of the card cage, the duct structure includes a plurality of duct members for directing air flow from the fans respectively toward respective air outlet ports of the casing, and the cover includes a backplane structure, a plurality of connector members attached to the backplane structure for engaging complementary connector members attached to pin electronics cards in the first card cage and cables that are connected to the backplane structure are threaded between the duct members of the duct structure.

16. A test head according to claim 15, comprising two opposite end walls, wherein the first and second walls of the first card cage are located between and are perpendicular to the two end walls, the cover is mounted for pivotal movement about an axis perpendicular to the end walls, and the cables pass through an opening in at least one end wall.

* * * * *